US006973288B1

(12) United States Patent
Davis et al.

(10) Patent No.: US 6,973,288 B1
(45) Date of Patent: Dec. 6, 2005

(54) LINEARIZER FOR A PIN DIODE ATTENUATOR

(75) Inventors: Tom L. Davis, Carrollton, TX (US); Kim E. Beumer, Richardson, TX (US); Carey Ritchey, Plano, TX (US)

(73) Assignee: Microtune (Texas), L.P., Plano, TX (US)

( * ) Notice: Subject to any disclaimer, the term of this patent is extended or adjusted under 35 U.S.C. 154(b) by 679 days.

(21) Appl. No.: 09/970,311

(22) Filed: Oct. 3, 2001

(51) Int. Cl.$^7$ ............................................. H04B 17/00
(52) U.S. Cl. ................. 455/67.11; 455/169.2; 455/180.4
(58) Field of Search .................. 455/67.11, 67.13, 455/423–425, 226.2, 226.3, 136, 169.2, 180.4, 455/191.2, 115.1–115.4

(56) References Cited

U.S. PATENT DOCUMENTS

| 4,646,036 A | * | 2/1987 | Brown ...................... 333/81 R |
| 6,091,299 A | * | 7/2000 | Gruneisen ................... 330/149 |
| 6,285,865 B1 | | 9/2001 | Vorenkamp et al. |

FOREIGN PATENT DOCUMENTS

JP          8 078993 A    3/1996

OTHER PUBLICATIONS

"A CATV Attenuator Using the Single Package SMP1307-027 PIN Diode Array," Alpha Industries, Inc. APN 1017, pp. 1-10 Nov. 1999.
"Design with PIN Diodes," Alpha Industries, Inc., APN 1002, pp. 1-18, copyright Alpha Industries, Inc., 1999.
"Linear Driver for PIN Diode Attenuators," DR65-0002 Tyco Electronics MA-COM, 2 pages.
Fisher, D.A. et al., "A temperature-compensated linearizing technique for MMIC attenuators utilizing GaAs MESFETs as voltage-variable resistors," IEEE MTT-S International Microwave Symposium Digest, May 8, 1990, pp. 781-784.
International Search Report for PCT/US02/31260 dated Dec. 12, 2003.

* cited by examiner

*Primary Examiner*—Duc Nguyen
(74) *Attorney, Agent, or Firm*—Fulbright & Jaworski LLP

(57) ABSTRACT

Linearizer circuitry is disclosed for providing control signal outputs to operate a controllable attenuator throughout a relatively large dynamic range while maintaining a relatively consistent return loss. Preferred embodiment linearizer circuitry provides a series control current and a shunt control current for coupling to a PIN diode attenuator, such as may be configured in a π network or a T network. Preferably, differential pairs are utilized in providing each of the control current outputs.

33 Claims, 2 Drawing Sheets

LINEARIZER FOR A PIN DIODE ATTENUATOR

RELATED APPLICATIONS

The present application is related to concurrently filed commonly assigned United States patent application Ser. No. 09/970,351 entitled "Broadband PIN Diode Attenuator Bias Network," the disclosure of which is hereby incorporated herein by reference.

TECHNICAL FIELD

The invention relates generally to attenuator circuitry and, more particularly, to circuitry to provide attenuation control linearly with respect to an attenuation control signal.

BACKGROUND

A common requirement in radio frequency (RF) circuits is the control of RF signal levels. For example, often in RF systems, such as CATV cable television systems, RF signal levels vary significantly resulting in unpredictable and/or undesired operation of particular components thereof, such as receivers, tuners, repeaters, and the like. Accordingly, such systems often utilize controllable signal attenuators, such as at the input stage of one of the aforementioned components, in order to provide a relatively constant RF signal level as provided to such components.

Often the above mentioned controllable attenuators are provided with a voltage controlled RF attenuator such as a linear attenuator. A linear attenuator typically has three ports or interfaces; those being an RF input port, an RF output port, and a control input. Ideally, a linear attenuator provides attenuation (generally expressed in decibels) between the RF input and RF output ports that is a linear function of a control input. Other desirable attributes of a linear attenuator include maintaining a good impedance match at the RF ports with respect the circuit coupled thereto over the control and frequency range, providing a flat attenuation response over a wide band of frequencies, introducing little or no excess noise into the circuit, and generating little or no distortion in the signals attenuated thereby. In RF systems that operate with signals of more than one octave of RF spectrum (broadband) the attenuator must also ensure that, in addition to acting as an attenuator, the RF impedance (return loss) of both the input and output of the attenuator is held as close as possible to the desired system impedance. Failure to maintain a proper impedance match can greatly affect the system frequency response (power transfer) and noise figure.

However, prior art linear attenuators generally provide a tradeoff with respect to these desirable attributes and, therefore, often provide less than ideal operation in demanding system applications. For example, there is generally a trade off between providing a flat attenuation response across a broadband signal and maintaining a good impedance match throughout the control and frequency range. Similarly, previous attenuation circuit implementations have experienced a trade off between providing attenuation that is a linear function of the control input and providing a low insertion loss. Specifically, PIN diode attenuator circuits are available that will provide decibel per volt linearization, but typically will have a minimum of approximately 3 to 4 dB insertion loss.

One common implementation of a linear attenuator consists of a two section embodiment including a PIN diode attenuator section and a linearizer section coupled to the PIN diode attenuator section. In such a configuration, a PIN diode network, such as a $\pi$ network or a T network, and passive bias components form the PIN diode attenuator section and provide attenuation of signals passed therethrough in response to a control voltage applied to the attenuator section. Specifically, the PIN diodes exhibit a variable RF resistance that is inversely proportion to the DC current through the diode and, therefore, the arrangement of PIN diodes and the corresponding bias components provides a circuit in which variable attenuation is achieved in response to a control voltage applied to bias components.

Such a PIN diode attenuator transfer function of RF attenuation versus DC current is non-linear due to the non-linear RF resistance of the PIN diodes versus bias current. Accordingly, a linearizer section is provided to allow a linear control voltage applied to an input of the linearizer section to result in a corresponding linear attenuation response of an RF signal applied to the PIN diode attenuator section.

Next-generation digital cable set-top boxes, such as those conforming to the OPENCABLE tuner specifications from Cable Television Laboratories, Inc., must provide attenuation in a large dynamic range (gain control range), such as on the order of 30 dB of dynamic range and beyond, while maintaining the RF input impedance of the device, such as 75 ohms. However, PIN diode attenuator configurations, such as those described above, have heretofore been unable to adequately address such requirements. For example, previously known T attenuator structures are precluded for use in the above conditions as 30 dB of dynamic range is not available with commercially available PIN diodes in the prior art T network configurations. Similarly, previously known $\pi$ attenuator structures, although perhaps able to achieve a relatively large dynamic range, generally are not able to maintain the return loss or impedance match over this dynamic range. For example, typical prior art $\pi$ attenuator structures result in poor return loss in designs with more than 15 dB of attenuation.

Moreover, the linearizer section of such prior art linear attenuators are not adapted to maximize the performance of the pin diode structures based on minimum insertion loss of the device and the linearity, or the decibel insertion loss per volt structure of the gain control, while maintaining an optimized impedance match for the return loss of the attenuator over its entire attenuation range. Specifically, prior art linearizer sections generally do not provide decibel per volt linear gain control functions in a linear attenuator having a minimum insertion loss and which maintains the return loss of the attenuator over a range of attenuation greater than 15 dB. For example, there are prior art linear attenuators available that will provide a decibel per volt linearization, but typically will result in the attenuator operating at 3 or 4 dB of minimum insertion loss. Additionally, there are prior art linear attenuators available which attempt to act as a linearizer, however these linear attenuators have been unable to achieve a return loss of better than approximately 10 dB over a relatively wide dynamic operating range, such as 30 dB of dynamic attenuation. Such insertion losses and return loss levels are unacceptable in demanding system applications, such as systems conforming to next generation specifications for cable television equipment.

One prior art solution attempting to meet the above goals is to use a circuit that has break points, e.g., a portion of the desired dynamic range is provided within a first circuit break point and another portion of the desired dynamic range is provided within a second circuit break point. However, this solution suffers from the disadvantage that the attenuator must generally be manually adjusted for the break points. Moreover, the break points typically cause discontinuities in the transfer curve.

Accordingly, a need exists in the art for a linearizer circuit which operates a corresponding attenuator circuit relatively linearly with respect to an attenuation control signal, such as decibel per volt linearization, while ensuring that the attenuator circuit maintains a desired return loss over a relatively large dynamic range, such as on the order of 30 dB.

SUMMARY OF THE INVENTION

The present invention is directed to a system and method in which a simple linearizer circuit is provided which approximates the ideal linearizer for PIN diode networks which are configured to provide controllable attenuators having a relatively low insertion loss over a relatively large dynamic range. Linearizers of the present invention are provided for various PIN diode network topologies, including a π network and a T network.

It should be appreciated that, given a perfect linearizer, a PIN diode attenuator, having the PIN diodes arranged in an appropriate topology and having a bias components coupled thereto, can approach the ideal. Unfortunately, a perfect linearizer must provide control currents to the PIN diodes that are highly non-linear and vary over several orders of magnitude. Current linearizer designs are complex and usually deviate significantly from the ideal.

Preferred embodiments of the present invention provide a linearizer which controls PIN diode attenuators by the application of control (bias) current at two control ports of the PIN diode network. Although one of the difficulties in meeting the goals of maintaining good return loss and a very linear attenuation is that the currents that are required to control the PIN diodes have to be very non-linear, in developing the present invention it was recognized that the non-linear transfer characteristics that the linearizer is to generate are very close to matching the equations of a bipolar transistor differential pair. Accordingly, the preferred embodiment linearizer circuit utilizes bipolar differential pair circuit portions in providing linear control of an attenuator circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

The linearizer of the preferred embodiment of the present invention is adapted to operate with an attenuator topology having two attenuator control inputs. Although the complexity of the linearizer circuitry is increased by the preferred embodiment multiple control current configuration, this configuration allows control of diode currents independently of each other and, therefore, attenuator circuits may be controlled for optimized insertion loss and return loss at any given point of their dynamic range. Moreover, the recognition in developing the present invention that non-linear behavior exhibited by PIN diodes approximates the characteristics of a differential pair, such as a bipolar junction transistor differential pair or a MOSFET differential pair operated in the sub-threshold region, has been leveraged according to the preferred embodiment in providing a simplified multiple control signal output linearizer circuit according to the present invention.

Figure 1A:
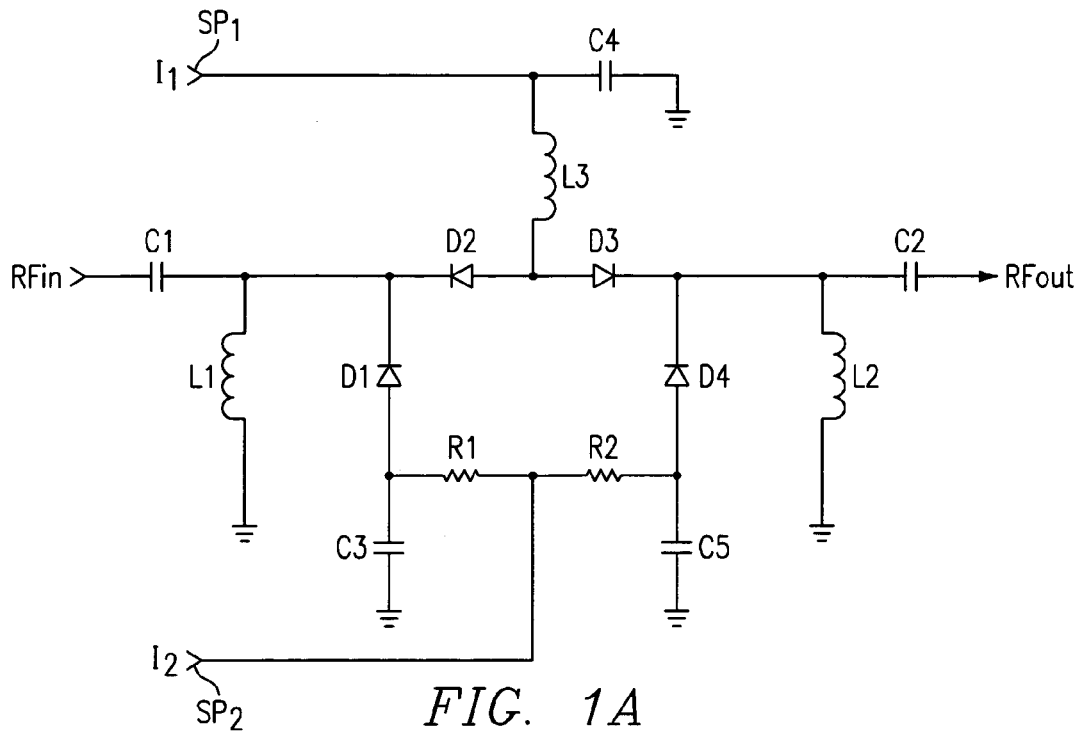
FIGS. 1A and 1B show PIN diode attenuator configurations such as may be controlled by linearizer circuitry of the present invention.

A PIN diode attenuator operable with linearizers of the present invention is provided by connecting PIN diodes in a π network wherein the cathodes of all PIN diodes in the π network are DC grounded, such as through large value inductors coupling the cathodes to DC ground, providing a common cathode point bias voltage which is constant. This attenuator topology provides for a control current to be applied to the π network shunt diodes and series diode(s) separately. A preferred embodiment of a PIN diode π network is shown in FIG. 1A and is described in detail in the above referenced patent application entitled "Broadband PIN Diode Attenuator Bias Network." Specifically, FIG. 1A presents a complete circuit for an attenuator that employs an unbalanced, symmetrical π network of PIN diodes. RF input port ($RF_{in}$) and RF output port ($RF_{out}$) accept an RF signal to be attenuated using PIN diodes D1–D4 and output an attenuated RF signal, respectively. Attenuation control signal port $SP_1$ and attenuation signal control port $SP_2$ receive bias currents from the linearizer ($I_1$ and $I_2$, respectively) to control the RF resistances of diodes D1–D4. Capacitors C1 and C2 are DC blocking capacitors and capacitors C3, C4, and C5 provide RF shorts to ground. Inductors L1, L2, and L3 pass bias currents but present a high impedance at RF frequencies. Resistors R1 and R2 serve to decouple the anodes of diodes D1 and D4 and, thus, provide blocking of a possible RF leakage path.

Figure 1B:
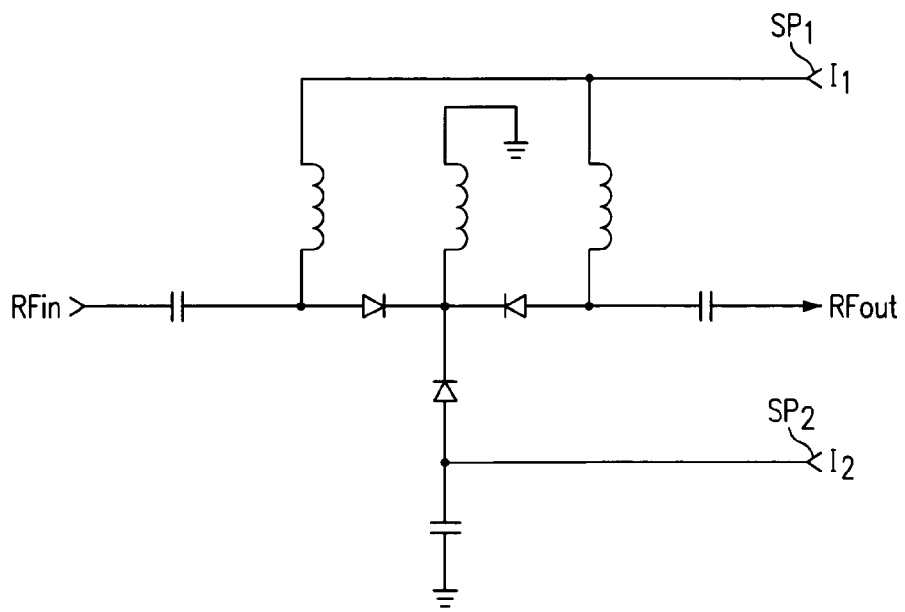

Another embodiment of a PIN diode attenuator operable with linearizers of the present invention is provided by connecting the PIN diodes in a T network wherein the cathodes of all PIN diodes in the T network are DC grounded, such as through a large value inductor coupling the cathodes to DC ground, providing a common cathode point bias voltage which is constant. As with the preferred embodiment π network discussed above, the preferred embodiment T network arrangement provides for control current to be applied to the T network shunt diode and series diodes separately. A preferred embodiment of a PIN diode T network, having an RF input port, an RF output port, attenuation control signal port $SP_1$, and attenuation control signal port $SP_2$, is shown in FIG. 1B and is described in detail in the above referenced patent application entitled "Broadband PIN Diode Attenuator Bias Network."

In developing a linearizer circuit according to the present invention for use with a PIN diode attenuator, such as those employing topologies as discussed above with respect to preferred embodiment PIN diode attenuators, it was necessary to determine how to generate proper input control currents for the attenuator to achieve a desired or commanded level of attenuation (A) while maintaining the RF input impedance of the device throughout the dynamic range of attenuation.

Initially it is noted that PIN diode RF resistance (R) is a function of the DC current (I) flowing through the diode. An accepted mathematical model of this operation of a PIN diode is represented below.

$$R = \frac{K}{I^a} + R_s \tag{1}$$

In the above equation, K, α, and $R_S$ are constants which vary with diode type and packaging. Experimentation has revealed, however, that the series resistance ($R_S$) is normally on the order of one ohm and that the exponent α is usually just less than 1, such as on the order of 0.8 or 0.9 for typical PIN diodes.

Preferred embodiments of the present invention provide for a relatively large dynamic attenuation range, such as on the order of 30 dB. Accordingly, it is desirable to represent the commanded level of attenuation A in decibels as a scaled function that is mathematically convenient. The following linear scalar of A provides a suitable mathematical scaling.

$$\theta = \frac{\ln(10)}{20} A \tag{2}$$

Accordingly, θ is used herein as a scaled function of the commanded attenuation A (preferably in decibels) in solving for the appropriate control signals to be applied by a linearizer of the present invention to the control inputs of a PIN diode attenuator.

In developing a preferred embodiment linearizer, the following equations were used to represent the resistances PIN diodes disposed in a π attenuator circuit should ideally obey.

$$R_A = \frac{Z_0}{2}\sinh(\theta) \tag{3}$$

$$R_B = \frac{Z_0}{\tanh\left(\frac{\theta}{2}\right)} \tag{4}$$

Specifically, $R_A$ represents the RF resistance (in ohms) of diodes disposed in a series configuration, e.g., diodes D2 and D3 of FIG. 1A. Similarly, $R_B$ represents the RF resistance (in ohms) of diodes disposed in a shunt configuration, e.g., diodes D1 and D4 of FIG. 1B. $Z_0$ is the characteristic impedance of the system, such as might be 75 ohms in a typical CATV application.

Substituting the series and shunt resistances, equations (3) and (4), into the PIN diode model equation, equation (1), and solving for the current (I) provides the following equations, respectively, wherein the subscripts 1 and 2 represent the series and shunt elements, and wherein the multiplier 2 is provided to accommodate providing the control current to 2 series or shunt diodes of the preferred embodiment.

$$I_1 = 2\left[\frac{2K_1}{Z_0\sinh(\theta) - 2R_{s1}}\right]^{\frac{1}{\alpha_1}} \tag{5}$$

$$I_2 = 2\left[\frac{K_2\tanh\left(\frac{\theta}{2}\right)}{Z_0 - R_{s2}\tanh\left(\frac{\theta}{2}\right)}\right]^{\frac{1}{\alpha_2}} \tag{6}$$

It should be appreciated that the above equations provide a mathematical representation of the circuit bias currents as a function of commanded attenuation for a PIN diode attenuator such as that shown in FIG. 1A. Moreover, it should be appreciated that the above equations provide the inverse mathematical representation of the circuit bias currents as a function of commanded attenuation for a PIN diode attenuator such as that shown in FIG. 1B, e.g., $1/I_1$ and $1/I_2$, respectively. Accordingly, the above equations may be utilized in designing a linearizer circuit for use with PIN diode attenuators.

However, it is readily apparent that the above circuit bias equations, equations (5) and (6), do not easily lend themselves to a circuit implementation. Specifically, these two equations are very complex and a straight forward, non-linear circuit implementation of these equations would be extremely complex and would likely suffer stability problems. Accordingly, in developing the preferred embodiment linearizer the above equations were simplified for circuit implementation.

Experimentation and simulation has shown that the circuit bias equations, equations (5) and (6), may be simplified in a number of ways. For example, as mentioned above, the constant α for typical PIN diodes has been found to be generally on the order of 0.8 or 0.9 and, therefore, the exponents $1/\alpha_1$ and $1/\alpha_2$ may be approximated as 1. The series resistance $R_S$ is of a low enough value that its being dropped from the equations for purposes of simplification should still provide a suitable approximation.

Using the approximations discussed above, as well as assumptions as discussed below, the circuit bias equations, equations (5) and (6), were simplified as shown below.

$$I_1 = \frac{8K_1}{Z_0(\exp(\theta) - 1)} \tag{7}$$

$$I_2 = \frac{2K_2}{Z_0 - R_{s2}}\tanh\left(\frac{\theta}{2}\right) \tag{8}$$

In simplifying circuit bias equation (5) to arrive at simplified circuit bias equation (7), it was appreciated that $\sinh(\theta) = (e^\theta - e^{-\theta})/2$. Making the assumption that $e^{-\theta}$ may be approximated as 1, $\sinh(\theta)$ was replaced by $(e^\theta - 1)/2$ in circuit bias equation (7). Similarly, in simplifying circuit bias equation (6) to arrive at simplified circuit bias equation (8), it was assumed that the hyperbolic tangent in the denominator could be assumed to be approximately one and, therefore, dropped from the circuit bias equation.

Having arrived at a simplified representation of the circuit bias currents to be provided to the diode attenuator for linearized operation, the simplified circuit bias equations, equations (7) and (8), were transformed into a non-linear circuit implementation. Specifically, in providing the preferred embodiment linearizer circuit implementation, the simplified circuit bias equations were related to a transistor differential pair, such as the differential pair of FIG. 2. The differential pair of FIG. 2 includes transistors $Q_a$ and $Q_b$ coupled in a circuit such that $I_a = e^{((V_a - V_e)/V_t)}$ and $I_b = e^{((V_b - V_e)/V_t)}$, where $V_t$ is the thermal voltage.

Figure 2:
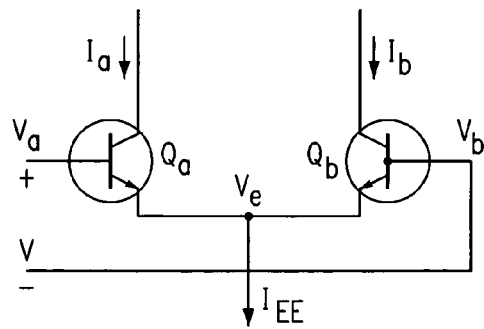
FIG. 2 shows a bipolar transistor differential pair as may be utilized according to a preferred embodiment in providing control current output.

The approximation for the series control signal ($I_1$) can be realized as the collector current $I_b$ using the differential pair of FIG. 2 by setting $V = V_t \theta$ and driving the emitter current, $I_{EE}$, so that the collector currents have the constant offset $I_a - I_b = (8\ K_1)/Z_0$. The approximation for the shunt control signal ($I_2$) can be realized as the difference between the collector currents $I_b - I_a$ using the differential pair of FIG. 2 by setting $V = V_t \theta$ and the emitter current $I_{EE} = (2\ K_2)/(Z_0 - R_{S2})$. Accordingly, it should be appreciated that PIN diodes which are well modeled by equation (1) above, $0.7 \leq \alpha \leq 1$, $Z_0 >> R_S$, are well suited for use in a diode attenuator for which control is provided by a linearizer of the present invention.

Figure 3:
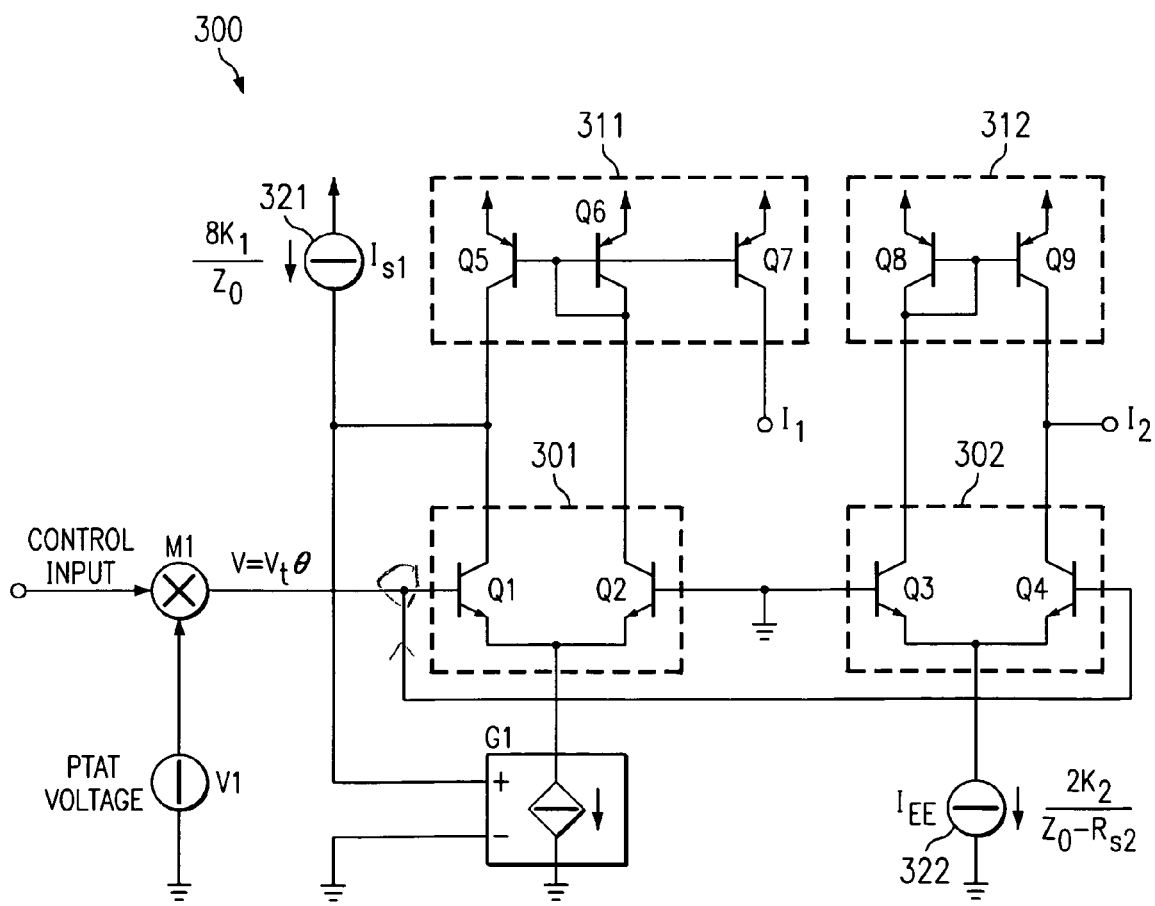
FIG. 3 shows a preferred embodiment linearizer circuit of the present invention.

Directing attention to FIG. 3, a preferred embodiment linearizer circuit utilizing differential pairs to provide a series control signal ($I_1$) and a shunt control signal ($I_2$) as described above is shown as linearizer circuit 300. Specifically, differential pair 301, including transistors Q1 and Q2, is utilized in linearizer circuit 300 in providing series control signal $I_1$ and differential pair 302, including transistors Q3 and Q4, is utilized in linearizer circuit 300 in providing shunt control signal $I_2$.

As discussed above, according to the preferred embodiment the base voltage for the transistors disposed in the differential pair is preferably set to $V_t \theta$. However, this control voltage has a temperature dependency because of the presence of $V_t$ in the equation, where $V_t = kT/q$, where k is Boltzmann's constant and q is the charge of an electron. Accordingly, without compensating circuitry, changes in temperature would result in changes in the control currents provided by linearizer circuit 300. In order to compensate for this temperature behavior, the control voltage of the preferred embodiment is multiplied by a PTAT (Proportional To Absolute Temperature) quantity. For example, compensation for the temperature variant $V_t$ may be done by multiplying the control voltage input and the PTAT voltage (V1) in linear multiplier (M1). The resulting temperature compensated control voltage may then be used to drive the two differential pairs as described above.

It should be appreciated that although a base voltage differential across the transistors of the differential pairs is illustrated as being with respect to a ground (the base of transistors Q2 and Q3 illustrated as being at a ground potential), it should be appreciated that the voltage $V_t \theta$, may be provided as a differential voltage. For example, the ground coupled to the bases of transistors Q2 and Q3 may be a DC ground having a potential (whether positive or negative) with respect to zero potential ground. Accordingly, $V_t \theta$ may be provided as a differential potential.

In providing series control signal $I_1$, the preferred embodiment linearizer circuit shown in FIG. 3 synthesizes the simplified series circuit bias equation, equation (7), using transistors Q1, Q2, Q5, Q6, and Q7. Transistors Q1 and Q2 provide differential pair 301 while transistors Q5, Q6, and Q7 provide current mirror 311 used in providing series control current $I_1$ equal to the collector current of Q2. Gain block (G1) forces the difference of the collector current of Q1 and Q2 to be equal to the current $I_{S1}$ by controlling the tail current ($I_{EE}$) of differential pair Q1 and Q2. The collector current of transistor Q2, which is the current $I_1$ as given by equation (5), is mirrored for output by transistor Q7.

It should be appreciated that current $I_{S1}$, $(8\ K_1)/Z_0$ in the preferred embodiment, is dependent upon the characteristics of the particular PIN diodes utilized in implementing the attenuator controlled using linearizer circuit 300. Specifically, as discussed above with respect to the mathematical model of operation of PIN diodes, equation (1), the constant $K_1$ varies with diode type and packaging. Accordingly, a preferred embodiment of current source 321 providing current $I_{S1}$ is programmable, such as by digital input or use of a control circuit, to accommodate the use of PIN diodes having different characteristics associated therewith. Similarly, preferred embodiment current sources of the present invention may include programmable or adjustable current adjustment to compensate for thermal variations of the PIN diode structures, such as by providing properly compensated control currents in response to monitored operational temperature.

In providing shunt control signal $I_2$, the preferred embodiment linearizer circuit shown in FIG. 3 synthesizes the simplified shunt circuit bias equation, equation (8), using transistors Q3, Q4, Q8, and Q9. Transistors Q3 and Q4 provide differential pair 302 while transistors Q8 and Q9 provide current mirror 312 used in providing shunt control current $I_2$ equal to the difference between the collector current of Q4 and the collector current of Q3. Tail current $I_{EE}$ is set to the desired value as discussed above. The current mirror provided by transistors Q8 and Q9 subtracts the collector current of Q3 from Q4 to thereby provide the desired output shunt control current $I_2$.

It should be appreciated that current $I_{EE}$, $(2\ K_2)/(Z_0 - R_{S2})$ in the preferred embodiment, is dependent upon the characteristics of the particular PIN diodes utilized in implementing the attenuator controlled using linearizer circuit 300. Specifically, as discussed above with respect to the mathematical model of operation of PIN diodes, equation (1), the constants $K_2$ and $R_{S2}$ vary with diode type and packaging. Accordingly, a preferred embodiment of current source 322 providing current $I_{EE}$ is programmable, such as by digital input or use of a control circuit, to accommodate the use of PIN diodes having different characteristics associated therewith. Similarly, preferred embodiment current sources of the present invention may include programmable current adjustment to compensate for thermal variations of the PIN diode structures, such as by providing properly compensated control currents in response to monitored operational temperature.

Having described a preferred embodiment linearizer circuit of the present invention in detail, it should be appreciated that various alterations may be made thereto in accordance with the principals of the present invention as disclosed herein. For example, in order to provide a linearizer circuit with relatively low power requirements, alternative embodiments of the present invention may utilize current multipliers between the linearizer circuit implementation and the control current outputs of the present invention. Accordingly, an alternative embodiment of linearizer circuit 300 includes a linear multiplication factor in current mirror 311 or after current mirror 312 to thereby provide a desired control current level which is greater than the operating currents of the differential pairs. Similarly, although the preferred embodiment linearizer circuit 300 has been discussed above with reference to a π network PIN diode attenuator, it should be appreciated that the disclosed linearizer circuit may be utilized with other attenuator configurations. For example, linearizer circuit 300 may be utilized in controlling a T network PIN diode attenuator by using appropriate circuits to compute the reciprocal of each of the output currents $I_1$ and $I_2$.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for providing linearized operation of a RF circuit, said system comprising:
    a first transistor differential pair;
    a second transistor differential pair;
    a control signal input port;
    a first control signal output port, wherein said first control signal output port is coupled to said control signal input port through said first transistor differential pair;
    a second attenuator control signal output port, wherein said second control signal output port is coupled to said control signal input port through said second transistor differential pair; and
    a temperature compensation circuit coupled to said control signal input port to provide temperature compensation with respect to a control signal applied thereto.

2. The system of claim 1, wherein said RF circuit is a PIN diode attenuator circuit providing decibel per volt linear gain control by said system.

3. The system of claim 2, wherein a first control signal output at said first control signal output port is a series PIN diode bias current.

4. The system of claim 2, wherein a second control signal output at said second control signal output port is a shunt PIN diode bias current.

5. The system of claim 2, wherein a first control signal output at said first control signal output port and a second control signal output at said second control signal output cooperate to control said PIN diode attenuator circuit to provide an optimized impedance match for a return loss of said PIN diode attenuator over a dynamic attenuation range of at least 30 dB.

6. The system of claim 1, wherein said control signal input port is coupled to said first transistor differential pair at a base of one transistor of said first transistor differential pair.

7. A system for providing linearized operation of a RF circuit, said system comprising:
    a first transistor differential pair;
    a second transistor differential pair;
    a control signal input port, wherein said control signal input port is coupled to said first transistor differential pair at a base of one transistor of said first transistor differential pair, wherein a base of another transistor of said first transistor differential pair is coupled substantially directly to a ground point;
    a first control signal output port, wherein said first control signal output port is coupled to said control signal input port through said first transistor differential pair; and
    a second attenuator control signal output port, wherein said second control signal output port is coupled to said control signal input port through said second transistor differential pair.

8. A system for providing linearized operation of a RF circuit, said system comprising:
    a first transistor differential pair;
    a second transistor differential pair;
    a control signal input port, wherein said control signal input port is coupled to said first transistor differential pair at a base of one transistor of said first transistor differential pair;
    a first control signal output port, wherein said first control signal output port is coupled to said control signal input port through said first transistor differential pair;
    a second attenuator control signal output port, wherein said second control signal output port is coupled to said control signal input port through said second transistor differential pair; and
    a first current source circuit, wherein said first current source circuit is coupled to a collector of said same transistor of said first second transistor differential pair that said control signal input port is coupled to said base of.

9. The system of claim 8, wherein said first current source circuit provides a current substantially corresponding to the value $(8\ K)/Z_0$, wherein K is a constant of a component of said RF circuit and $Z_0$ is the characteristic impedance of a system into which said RF circuit is inserted.

10. The system of claim 8, wherein said first current source circuit is programmable for use of said system with a plurality of different said RF circuit components.

11. The system of claim 8, wherein said first current source circuit is adjustable in response to temperature variations.

12. The system of claim 6, wherein a first control signal output at said first control signal output port is directly related to a collector current of another transistor of said first transistor differential pair.

13. The system of claim 1, wherein said control signal input port is coupled to said second transistor differential pair at a base of one transistor of second transistor differential pair.

14. A system for providing linearized operation of a RF circuit, said system comprising:
    a first transistor differential pair;
    a second transistor differential pair;
    a control signal input port, wherein said control signal input port is coupled to said second transistor differential pair at a base of one transistor of second transistor differential pair, wherein a base of another transistor of said second transistor differential pair is coupled to a ground point;
    a first control signal output port, wherein said first control signal output port is coupled to said control signal input port through said first transistor differential pair; and a second attenuator control signal output port, wherein said second control signal output port is coupled to said control signal input port through said second transistor differential pair.

15. A system for providing linearized operation of a RF circuit, said system comprising:
- a first transistor differential pair;
- a second transistor differential pair;
- a control signal input port, wherein said control signal input port is coupled to said second transistor differential pair at a base of one transistor of second transistor differential pair;
- a first control signal output port, wherein said first control signal output port is coupled to said control signal input port through said first transistor differential pair;
- a second attenuator control signal output port, wherein said second control signal output port is coupled to said control signal input port through said second transistor differential pair; and
- a second current source circuit, wherein said second current source circuit is coupled to an emitter of two transistors of said second transistor differential pair including said same transistor of said second transistor differential pair that said control signal input port is coupled to said base of.

16. The system of claim 15, wherein said second current source circuit provides a current substantially corresponding to the value $(2\,K)/(Z_0-R_S)$, wherein K and $R_S$ are constants of a component of said RF circuit and $Z_0$ is the characteristic impedance of a system into which said RF circuit is inserted.

17. The system of claim 15, wherein said second current source circuit is programmable for use of said system with a plurality of different said RF circuit components.

18. The system of claim 15, wherein said second current source circuit is adjustable in response to temperature variations.

19. A system for providing linearized operation of a RF circuit, said system comprising:
- a first transistor differential pair;
- a second transistor differential pair;
- a control signal input port;
- a first control signal output port, wherein said first control signal output port is coupled to said control signal input port through said first transistor differential pair; and
- a second attenuator control signal output port, wherein said second control signal output port is coupled to said control signal input port through said second transistor differential pair, wherein a second control signal output at said second control signal output port is directly related to a difference of a collector current of a transistor of said second transistor differential pair and a collector current of another transistor of said second transistor differential pair.

20. A system for providing linearized operation of a RF circuit, said system comprising:
- a first transistor differential pair;
- a second transistor differential pair;
- a control signal input port;
- a first control signal output port, wherein said first control signal output port is coupled to said control signal input port through said first transistor differential pair;
- a second attenuator control signal output port, wherein said second control signal output port is coupled to said control signal input port through said second transistor differential pair; and
- a first current mirror coupled to said first transistor differential pair, wherein said first control signal output port is coupled to said first transistor differential pair through said first current mirror.

21. The system of claim 1, wherein said first transistor differential pair and said second transistor differential pair each comprise a bipolar junction transistor differential pair.

22. The system of claim 1, wherein said first transistor differential pair and said second transistor differential pair each comprise a MOSFET differential pair.

23. A system for providing linearized operation of a RF circuit, said system comprising:
- a first transistor differential pair;
- a second transistor differential pair;
- a control signal input port;
- a first control signal output port, wherein said first control signal output port is coupled to said control signal input port through said first transistor differential pair;
- a second attenuator control signal output port, wherein said second control signal output port is coupled to said control signal input port through said second transistor differential pair; and
- a second current mirror coupled to said second transistor differential pair, wherein said second control signal output port is coupled to said second transistor differential pair through said second current mirror.

24. A system for providing linearized operation of a PIN diode attenuator, said system comprising:
- a first transistor differential pair;
- a second transistor differential pair;
- a control signal input port, wherein said control signal input port accepts an attenuator control voltage applied thereto, wherein said control signal input port is coupled to said first and second transistor differential pairs at a base of one transistor of each of said first and second transistor differential pairs, and wherein a base of another transistor of each of said first and second transistor differential pairs is coupled substantially directly to a ground point;
- a first control signal output port, wherein said first control signal output port is coupled to said control signal input port through said first transistor differential pair, wherein a first control signal output at said first control signal output port is a series PIN diode bias current; and
- a second attenuator control signal output port, wherein said second control signal output port is coupled to said control signal input port through said second transistor differential pair, wherein a second control signal output at said second control signal output port is a shunt PIN diode bias current.

25. The system of claim 24, wherein said first control signal output at said first control signal output port is directly related to a collector current of another transistor of said first transistor differential pair, and wherein said second control signal output at said second control signal output port is directly related to a difference of a collector current of a transistor of said second transistor differential pair and a collector current of another transistor of said second transistor differential pair.

26. A system for providing linearized operation of a PIN diode attenuator, said system comprising:
- a first transistor differential pair;
- a second transistor differential pair;
- a control signal input port, wherein said control signal input port accepts an attenuator control voltage applied thereto, and wherein said control signal input port is coupled to said first and second transistor differential pairs at a base of on transistor of each of said first and second transistor differential pairs;

a first control signal output port, wherein said first control signal output port is coupled to said control signal input port through said first transistor differential pair, wherein a first control signal output at said first control signal output port is a series PIN diode bias current, wherein said first control signal output at said first control signal output port is directly related to a collector current of another transistor of said first transistor differential pair;

a second attenuator control signal output port, wherein said second control signal output port is coupled to said control signal input port through said second transistor differential pair, wherein a second control signal output at said second control signal output port is a shunt PIN diode bias current, wherein said second control signal output at said second control signal output port is directly related to a difference of a collector current of a transistor of said second transistor differential pair and a collector current of another transistor of said second transistor differential pair; and a first current source circuit, wherein said first current source circuit is coupled to a collector of said same transistor of said first second transistor differential pair that said control signal input port is coupled to said base of; and a second current source circuit, wherein said second current source circuit is coupled to an emitter of two transistors of said second transistor differential pair including said same transistor of said second transistor differential pair that said control signal input port is coupled to said base of.

27. The system of claim 26, wherein said first current source circuit provides a current substantially corresponding to the value $(8\ K)/Z_0$ and said second current source circuit provides a current substantially corresponding to the value $(2\ K)/(Z_0-R_S)$, wherein K and $R_S$ are constants of a component of said PIN diode attenuator and $Z_0$ is the characteristic impedance of a system into which said PIN diode attenuator is inserted.

28. The system of claim 26, wherein said first and second current source circuits are programmable for use of said system with a plurality of different PIN diodes.

29. The system of claim 26, wherein said first and second current source circuits are adjustable in response to temperature variations.

30. A method for providing linear operation of an attenuator, said method comprising:

accepting a control signal at a linearizer input port, wherein a signal accepted at said linearizer input port is a control voltage coupled to a base of a transistor of a first transistor differential pair and a base of a transistor of a second transistor pair;

outputting a first control signal at a first linearizer output port, wherein said first control signal is a first bias current corresponding to a collector current of said first transistor differential pair;

outputting a second control signal at a first linearizer output port, wherein said second control signal is a second bias current corresponding to a difference between collector currents of said second transistor differential pair; and compensating said control voltage accepted at said linearizer input port for temperature.

31. The method of claim 30, wherein said attenuator is provided decibel per volt linear gain control by said first and second control signals.

32. A method for providing linear operation of an attenuator, said method comprising:

accepting a control signal at a linearizer input port, wherein a signal accepted at said linearizer input port is a control voltage coupled to a base of a transistor of a first transistor differential pair and a base of a transistor of a second transistor pair;

outputting a first control signal at a first linearizer output port, wherein said first control signal is a first bias current corresponding to a collector current of said first transistor differential pair, wherein another collector current of said first transistor differential pair is controlled to substantially correspond to the value $(8\ K)/Z_0$, wherein K is a constant of a component of said attenuator and $Z_0$ is the characteristic impedance of a system into which said attenuator is inserted; and outputting a second control signal at a first linearizer output port, wherein said second control signal is a second bias current corresponding to a difference between collector currents of said second transistor differential pair.

33. A method for providing linear operation of an attenuator, said method comprising:

accepting a control signal at a linearizer input port, wherein a signal accepted at said linearizer input port is a control voltage coupled to a base of a transistor of a first transistor differential pair and a base of a transistor of a second transistor pair;

outputting a first control signal at a first linearizer output port, wherein said first control signal is a first bias current corresponding to a collector current of said first transistor differential pair; and outputting a second control signal at a first linearizer output port, wherein said second control signal is a second bias current corresponding to a difference between collector currents of said second transistor differential pair, wherein a sum of emitter currents of said second transistor differential pair is controlled to substantially correspond to the value $(2\ K)/(Z_0-R_S)$, wherein K and $R_S$ are constants of a component of said attenuator and $Z_0$ is the characteristic impedance of a system into which said attenuator is inserted.

* * * * *